United States Patent
Tang et al.

(10) Patent No.: US 9,577,960 B2
(45) Date of Patent: Feb. 21, 2017

(54) UNIVERSAL ERROR-CORRECTION CIRCUIT WITH FAULT-TOLERANT NATURE, AND DECODER AND TRIPLE MODULAR REDUNDANCY CIRCUIT THAT APPLY IT

(71) Applicant: Huawei Technologies Co., Ltd., Shenzhen (CN)

(72) Inventors: Yangyang Tang, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 58 days.

(21) Appl. No.: 14/581,570

(22) Filed: Dec. 23, 2014

(65) Prior Publication Data

US 2015/0188580 A1    Jul. 2, 2015

(30) Foreign Application Priority Data

Dec. 27, 2013  (CN) .......................... 2013 1 0740347

(51) Int. Cl.
  *H04L 1/00*  (2006.01)
  *H04L 12/939*  (2013.01)
  (Continued)

(52) U.S. Cl.
  CPC ........... *H04L 49/557* (2013.01); *G06F 11/187* (2013.01); *H03K 19/23* (2013.01);
  (Continued)

(58) Field of Classification Search
  CPC ...... G06F 11/187; H03K 19/23; H04L 49/557; H03M 13/1105; H03M 13/43; H03M 13/27
  (Continued)

(56) References Cited

U.S. PATENT DOCUMENTS 3,859,513 A * 1/1975 Chuang ................. G06F 11/181
                                                326/14
4,375,683 A * 3/1983 Wensley ............... G06F 11/187
                                                326/11
(Continued)

FOREIGN PATENT DOCUMENTS

CN      103368560 A    10/2013
CN      103389892 A    11/2013

OTHER PUBLICATIONS

Foreign Communication From a Counterpart Application, European Application No. 14198903.8, Extended European Search Report dated May 4, 2015, 4 pages.
(Continued)

*Primary Examiner* — Albert Decady
*Assistant Examiner* — Osman M Alshack
(74) *Attorney, Agent, or Firm* — Conley Rose, P.C.

(57) ABSTRACT

A universal error-correction circuit with fault-tolerant nature includes an error-correction unit with fault-tolerant nature implemented by a logic gate, where digital input signals of the error-correction unit with fault-tolerant nature are separately $I_0, I_1, \ldots, I_{2k-1}$, and $I_{2k}$, digital output signals of the error-correction unit with fault-tolerant nature are separately $O_0, O_1, \ldots, O_{k-2}$, and $O_{k-1}$, and the digital input signals and the digital output signals belong to a set $\{0,1\}$, where k is a positive integer. The error-correction unit with fault-tolerant nature is configured to, when k=1, set $O_0=I_0$ if $I_0=I_1$, and $O_0=I_2$ otherwise; and when k>1, set $O_{k-1}=I_{2k-1}$ if $O_{k-2}=I_{2k-1}$, and $O_{k-1}=I_{2k}$ otherwise. Because a logical relationship between input and output is uniquely certain, the error-correction circuit with fault-tolerant nature may be implemented only by a logic gate.

16 Claims, 7 Drawing Sheets

(51) Int. Cl.
*H03M 13/00* (2006.01)
*H03M 13/11* (2006.01)
*G06F 11/18* (2006.01)
*H03K 19/23* (2006.01)
*H03M 13/27* (2006.01)
*H03M 13/43* (2006.01)

(52) U.S. Cl.
CPC ... *H03M 13/1105* (2013.01); *H03M 13/6508* (2013.01); *H03M 13/27* (2013.01); *H03M 13/43* (2013.01)

(58) Field of Classification Search
USPC ........................................ 714/752, 799, 760
See application file for complete search history.

(56) References Cited

U.S. PATENT DOCUMENTS

| | | | | |
|---|---|---|---|---|
| 4,794,601 | A * | 12/1988 | Kikuchi | G06F 11/10 |
| | | | | 714/758 |
| 5,574,849 | A * | 11/1996 | Sonnier | G01R 31/31727 |
| | | | | 711/E12.026 |
| 5,907,671 | A | 5/1999 | Chen et al. | |
| 5,917,838 | A * | 6/1999 | Wardrop | G06F 11/1044 |
| | | | | 714/746 |
| 6,550,018 | B1 * | 4/2003 | Abonamah | G06F 11/165 |
| | | | | 714/11 |
| 7,310,759 | B1 * | 12/2007 | Carmichael | G06F 11/1004 |
| | | | | 714/725 |
| 7,482,831 | B2 * | 1/2009 | Chakraborty | H03K 3/0375 |
| | | | | 326/11 |
| 8,081,010 | B1 | 12/2011 | Witaker et al. | |
| 2003/0229836 | A1 | 12/2003 | Matsumoto | |
| 2004/0230935 | A1 * | 11/2004 | Samudrala | H03K 19/17764 |
| | | | | 326/10 |
| 2008/0288844 | A1 * | 11/2008 | Nieuwland | G06F 11/10 |
| | | | | 714/746 |
| 2009/0249174 | A1 | 10/2009 | Lamb | |
| 2010/0070811 | A1 * | 3/2010 | Goessel | G06F 11/10 |
| | | | | 714/746 |
| 2013/0002288 | A1 * | 1/2013 | Augustin | H03K 19/00392 |
| | | | | 326/11 |
| 2015/0100839 | A1 * | 4/2015 | El-Maleh | G01R 31/3177 |
| | | | | 714/724 |

OTHER PUBLICATIONS

Foreign Communication From a Counterpart Application, Chinese Application No. 201310740347.5, Chinese Office Action dated Jan. 8, 2016, 5 pages.
Richardson, T., et al., "The Capacity of Low-Density Parity-Check Codes Under Message-Passing Decoding," IEEE Transactions on Information Theory, vol. 47, No. 2, Feb. 2001, 20 pages.
Tang, Y., et al., "Muller C-element based Decoder (MCD): A Decoder Against Transient Faults," Department of Electrical and Computer Engineering, May 1, 2013, 5 pages.
Lyons, R., et al., "The Use of Triple-Modular Redundancy to Improve Computer Reliability," IBM Journal, Apr. 1962, pp. 200-209.
Tang, Y., et al., "An LDPC Decoding Method for Fault-Tolerant Digital Logic," IEEE International Symposium on Circuits and Systems, May 20-23, 2012, 4 pages.
Winstead, C., et al., "A Space-Time Redundancy Technique for Embedded Stochastic Error Correction," 7th International Symposium on Turbo Codes & Iterative Information Processing, Sep. 11, 2012, 5 pages.

* cited by examiner

UNIVERSAL ERROR-CORRECTION CIRCUIT WITH FAULT-TOLERANT NATURE, AND DECODER AND TRIPLE MODULAR REDUNDANCY CIRCUIT THAT APPLY IT

CROSS-REFERENCE TO RELATED APPLICATION

This application claims priority to Chinese Patent Application No. 201310740347.5, filed on Dec. 27, 2013, which is hereby incorporated by reference in its entirety.

TECHNICAL FIELD

The present invention relates to the field of integrated circuit technologies, and in particular, to a universal error-correction circuit with fault-tolerant nature, and a decoder and a triple modular redundancy circuit that apply it.

BACKGROUND

Rapid development of electronic information leads to an increasingly higher usage rate of electronic chips. However, during use of an electronic chip, a soft error or a hard error may occur.

The soft error may be construed as a logic error of an electron tube. For example, 0 becomes 1, or 1 becomes 0.

The hard error may be construed as a permanent logic error of an electron tube.

However, some fields have a strict requirement on precision of the electronic chip, such as the aerospace and aviation field, the medical field, and the precision instrument field. No matter if it is the soft error or the hard error that occurs in the electronic chip, a serious result may always be caused.

Currently, a fault-tolerant technique widely used in the prior art is triple modular redundancy (TMR).

Referring to FIG. 1, the figure is a schematic diagram of fault-tolerance of triple modular redundancy in the prior art.

Three functions simultaneously execute a same operation. Output of the three functions serves as input of a voter; and the voter takes the same output that is in the majority as correct output of a voting system, which is usually called two out of three.

As long as two same errors do not occur in the three functions simultaneously, an error of a faulty function may be concealed, so that correct system output is ensured. Because the three functions are independent of each other, a case where two functions have errors simultaneously is of an extremely small probability, so that system reliability may be greatly increased.

However, hardware complexity caused by the triple modular redundancy is at least greater than more than twice the complexity of an original function. Further, when there is an error in a triple modular redundancy module itself, an output frame error rate may rise significantly, and a strong error-correction capability is not provided.

Therefore, a person skilled in the art needs to provide a universal error-correction circuit with fault-tolerant nature and a decoder that applies it, which are provided with general commonality and are provided with an extremely strong fault-tolerance and error-correction capability.

SUMMARY

Embodiments of the present invention provide a universal error-correction circuit with fault-tolerant nature, and a decoder and a triple modular redundancy circuit that apply it, which are provided with general commonality and an extremely strong fault-tolerance and error-correction capability.

According to a first aspect, an embodiment of the present invention provides a universal error-correction circuit with fault-tolerant nature, including: an error-correction unit with fault-tolerant nature implemented by a logic gate, where digital input signals of the error-correction unit with fault-tolerant nature are separately $I_0, I_1 \ldots, I_{2k-1}$, and $I_{2k}$, digital output signals of the error-correction unit with fault-tolerant nature are separately $O_0, O_1 \ldots, O_{k-2}$, and $O_{k-1}$, and the digital input signals and the digital output signals belong to a set $\{0,1\}$, where k is a positive integer; and the error-correction unit with fault-tolerant nature is configured to, when k=1, set $O_0=I_0$ if $I_0=I_1$, and $O_0=I_2$ otherwise, and when k>1, set $O_{k-1}=I_{2k-1}$ if $O_{k-2}=I_{2k-1}$, and $O_{k-1}=I_{2k}$ otherwise.

In a first possible implementation manner of the first aspect, when k=1 in the error-correction unit with fault-tolerant nature, three corresponding digital input signals are separately $I_0, I_1$, and $I_2$, and one corresponding digital output signal is $O_0$; the error-correction unit with fault-tolerant nature includes a first AND gate, a first OR gate, a second AND gate, and a second OR gate; two input signals of the first OR gate are separately $I_0$ and $I_1$; two input signals of the first AND gate are separately $I_0$ and $I_1$; one input signal of the second AND gate is $I_2$, and an output signal of the first OR gate serves as the other input signal of the second AND gate; an output signal of the second AND gate and an output signal of the first AND gate serve as two input signals of the second OR gate; and an output signal of the second OR gate serves as the output signal $O_0$ of the error-correction unit with fault-tolerant nature.

With reference to the first possible implementation manner of the first aspect, in a second possible implementation manner, when k=3 in the error-correction unit with fault-tolerant nature, seven corresponding digital input signals are separately $I_0, I_1, I_2, I_3, I_4, I_5$, and $I_6$, and three corresponding digital output signals are separately $O_0, O_1$, and $O_2$; the error-correction unit with fault-tolerant nature includes three error-correction subunits with fault-tolerant nature, which are separately a first error-correction subunit with fault-tolerant nature, a second error-correction subunit with fault-tolerant nature, and a third error-correction subunit with fault-tolerant nature, each error-correction subunit with fault-tolerant nature is corresponding to three digital input signals and one digital output signal, and each error-correction subunit with fault-tolerant nature includes a first AND gate, a first OR gate, a second AND gate, and a second OR gate; two input signals of both the first AND gate and the first OR gate are a first digital input signal and a second digital input signal, one input signal of the second AND gate is a third digital input signal, the other input signal of the second AND gate is an output signal of the first OR gate, and an output signal of the second AND gate and an output signal of the first AND gate serve as two input signals of the second OR gate; a first digital input signal, a second digital input signal, and a third digital input signal of the first error-correction subunit with fault-tolerant nature are $I_0, I_1$, and $I_2$, respectively, and an output signal of the first error-correction subunit with fault-tolerant nature is $O_0$; a first digital input signal, a second digital input signal, and a third digital input signal of the second error-correction subunit with fault-tolerant nature are $I_3, I_4$, and $O_0$, respectively, and an output signal of the second error-correction subunit with fault-tolerant nature is $O_1$; and a first digital input signal, a second digital input signal, and a third digital input signal of the third error-correction subunit with fault-tolerant nature are $I_5$, $I_6$, and $O_1$, respectively, and an output signal of the third error-correction subunit with fault-tolerant nature is $O_2$.

According to a second aspect, an embodiment of the present invention further provides a universal decoder, including a variable node module, an interleaver, a check node module, and a de-interleaver; where the variable node module includes the universal error-correction circuit with fault-tolerant nature; the interleaver is configured to randomly shuffle a received information sequence, then read the randomly shuffled information sequence from front to back, and send the read information sequence to the check node module; the check node module is configured to calculate external information output by the variable node module to obtain an information value of a check node; the de-interleaver is configured to randomly shuffle an information sequence, and then arrange the randomly shuffled information sequence from back to front; and the variable node module is configured to calculate external information output by the check node module to obtain an information value of a variable node.

In a first possible implementation manner of the second aspect, a weight of the variable node module in the decoder is three.

With reference to the first possible implementation manner of the second aspect, in a second possible implementation manner, the number of times of iterative decoding of the decoder is three.

With reference to the second aspect and any one of the foregoing possible implementation manners, in a third possible implementation manner, the check node module is implemented by an exclusive-OR gate circuit.

With reference to the second aspect and any one of the foregoing possible implementation manners, in a fourth possible implementation manner, a weight of the variable node module is six.

With reference to the second aspect and any one of the foregoing possible implementation manners, in a fifth possible implementation manner, the universal decoder is configured to decode low density parity check code.

According to a third aspect, an embodiment of the present invention further provides a triple modular redundancy circuit, where a voter in the triple modular redundancy circuit is implemented by the foregoing error-correction circuit with fault-tolerant nature; and the voter includes three digital input signals and one digital output signal.

An error-correction circuit with fault-tolerant nature provided by the foregoing technical solutions is provided with general commonality of application, and a specific function is determined by a digital input signal and a digital output signal. Because there is a unique certainty between input and output that are of the error-correction circuit with fault-tolerant nature, any circuit that meets a relationship between the input and output that are of the error-correction circuit with fault-tolerant nature provided by the present invention falls within the protection scope of the present invention. It can be understood that, because a logical relationship between the input and the output is uniquely certain, the error-correction circuit with fault-tolerant nature may be implemented only by a logic gate. There may be a plurality of specific implementation manners, as long as input and output meet the uniquely certain logical relationship of the present invention. Therefore, the error-correction circuit with fault-tolerant nature provided by the present invention is provided with general commonality.

BRIEF DESCRIPTION OF DRAWINGS

To describe the technical solutions in the embodiments of the present invention or in the prior art more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DESCRIPTION OF EMBODIMENTS

It should be noted that a universal error-correction circuit with fault-tolerant nature provided by an embodiment of the present invention includes an error-correction unit with fault-tolerant nature implemented by a logic gate, where digital input signals of the error-correction unit with fault-tolerant nature are separately $I_0$, $I_1 \ldots, I_{2k-1}$, and $I_{2k}$, digital output signals of the error-correction unit with fault-tolerant nature are separately $O_0$, $O_1 \ldots, O_{k-2}$, and $O_{k-1}$, and the digital input signals and the digital output signals belong to a set $\{0,1\}$, where k is a positive integer. The error-correction unit with fault-tolerant nature is configured to, when k=1, set $O_0=I_0$ if $I_0=I_1$, and $O_0=I_2$ otherwise; and when k>1, set $O_{k-1}=I_{2k-1}$ if $O_{k-2}=I_{2k-1}$, and $O_{k-1}=I_{2k}$ otherwise.

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

To make the foregoing objectives, features, and advantages of the present invention more evident and comprehensible, the following describes specific implementation manners of the present invention in details with reference to the accompanying drawings.

Embodiment 1

Figure 2:
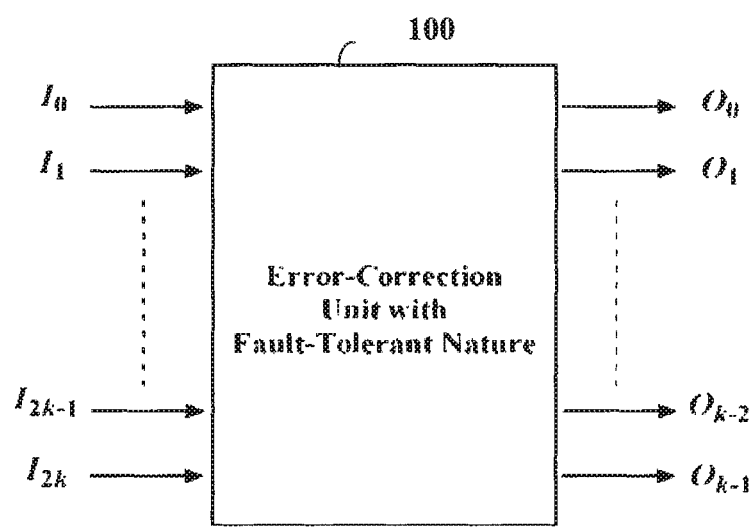
FIG. 2 is a schematic diagram of Embodiment 1 of a universal error-correction circuit with fault-tolerant nature according to the present invention.

Referring to FIG. 2, the figure is a schematic structural diagram of a universal error-correction circuit with fault-tolerant nature according to the present invention.

The universal error-correction circuit with fault-tolerant nature provided by this embodiment includes an error-correction unit 100 with fault-tolerant nature implemented by a logic gate.

Digital input signals of the error-correction unit 100 with fault-tolerant nature are separately $I_0, I_1 \ldots, I_{2k-1},$ and $I_{2k}$, digital output signals of the error-correction unit 100 with fault-tolerant nature are separately $O_0, O_1 \ldots, O_{k-2},$ and $O_{k-1}$, and the digital input signals and the digital output signals belong to a set $\{0,1\}$, where k is a positive integer.

The error-correction unit 100 with fault-tolerant nature is configured to, when k=1, set $O_0=I_0$ if $I_0=I_1$, and $O_0=I_2$ otherwise; and when k>1, set $O_{k-1}=I_{2k-1}$ if $O_{k-2}=I_{2k-1}$, and $O_{k-1}=I_{2k}$ otherwise.

To make a person skilled in the art better understand the technical solutions of the present invention, the following separately takes k=1 and k=2 as examples for description.

Figure 3:
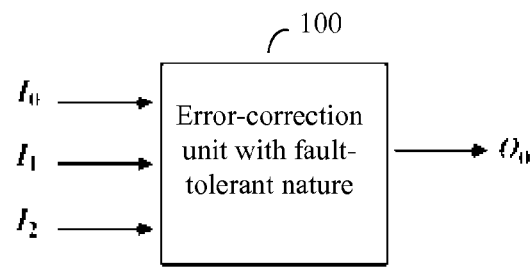
FIG. 3 is a schematic diagram of an error-correction circuit with fault-tolerant nature where k=1 according to the present invention.

Referring to FIG. 3, the figure is a schematic diagram of an error-correction circuit with fault-tolerant nature where k=1 according to the present invention.

In the error-correction circuit with fault-tolerant nature corresponding to FIG. 3, k=1, that is, three corresponding digital input signals are $I_0, I_1,$ and $I_2$, and one digital output signal is $O_0$.

A truth table of the digital input signals and the digital output signal that are corresponding to FIG. 3 is shown by Table 1.

TABLE 1

| Input | | | Output |
|---|---|---|---|
| $I_0$ | $I_1$ | $I_2$ | $O_0$ |
| 0 | 0 | 0 | 0 |
| 0 | 1 | 0 | 0 |
| 1 | 0 | 0 | 0 |
| 1 | 1 | 0 | 1 |
| 0 | 0 | 1 | 0 |
| 0 | 1 | 1 | 1 |
| 1 | 0 | 1 | 1 |
| 1 | 1 | 1 | 1 |

Figure 4:
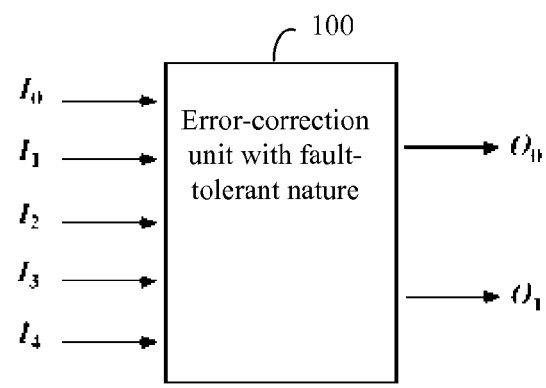
FIG. 4 is a schematic diagram of an error-correction circuit with fault-tolerant nature where k=2 according to the present invention.

The following introduces a case in which k=2 with reference to FIG. 4 and Table 2.

Referring to FIG. 4, the figure is a schematic diagram of an error-correction circuit with fault-tolerant nature where k=2 according to the present invention.

In the error-correction circuit with fault-tolerant nature corresponding to FIG. 4, k=2, that is, five corresponding digital input signals are $I_0, I_1, I_2, I_3,$ and $I_4$, and two digital output signals are $O_0,$ and $O_1$.

A truth table of the digital input signals and the digital output signals that are corresponding to FIG. 4 is shown by Table 2.

TABLE 2

| Input | | | | | Output | |
|---|---|---|---|---|---|---|
| $I_0$ | $I_1$ | $I_2$ | $I_3$ | $I_4$ | $O_0$ | $O_1$ |
| 0 | 0 | 0 | 0 | 0 | 0 | 0 |
| 0 | 1 | 0 | 0 | 0 | 0 | 0 |
| 1 | 0 | 0 | 0 | 0 | 0 | 0 |
| 1 | 1 | 0 | 0 | 0 | 1 | 0 |
| 0 | 0 | 1 | 0 | 0 | 0 | 0 |
| 0 | 1 | 1 | 0 | 0 | 1 | 0 |
| 1 | 0 | 1 | 0 | 0 | 1 | 0 |
| 1 | 1 | 1 | 0 | 0 | 1 | 0 |
| 0 | 0 | 0 | 1 | 0 | 0 | 0 |
| 0 | 1 | 0 | 1 | 0 | 0 | 0 |
| 1 | 0 | 0 | 1 | 0 | 0 | 0 |
| 1 | 1 | 0 | 1 | 0 | 1 | 1 |
| 0 | 0 | 1 | 1 | 0 | 0 | 0 |
| 0 | 1 | 1 | 1 | 0 | 1 | 1 |
| 1 | 0 | 1 | 1 | 0 | 1 | 1 |
| 1 | 1 | 1 | 1 | 0 | 1 | 1 |
| 0 | 0 | 0 | 0 | 1 | 0 | 0 |
| 0 | 1 | 0 | 0 | 1 | 0 | 0 |
| 1 | 0 | 0 | 0 | 1 | 0 | 0 |
| 1 | 1 | 0 | 0 | 1 | 1 | 1 |
| 0 | 0 | 1 | 0 | 1 | 0 | 0 |
| 0 | 1 | 1 | 0 | 1 | 1 | 1 |
| 1 | 0 | 1 | 0 | 1 | 1 | 1 |
| 1 | 1 | 1 | 0 | 1 | 1 | 1 |
| 0 | 0 | 0 | 1 | 1 | 0 | 1 |
| 0 | 1 | 0 | 1 | 1 | 0 | 1 |
| 1 | 0 | 0 | 1 | 1 | 0 | 1 |
| 1 | 1 | 0 | 1 | 1 | 1 | 1 |
| 0 | 0 | 1 | 1 | 1 | 0 | 1 |
| 0 | 1 | 1 | 1 | 1 | 1 | 1 |
| 1 | 0 | 1 | 1 | 1 | 1 | 1 |
| 1 | 1 | 1 | 1 | 1 | 1 | 1 |

It can be obtained, by analysis according to FIG. 3, FIG. 4, Table 1, and Table 2, that no matter k=1 or k=2, the error-correction unit with fault-tolerant nature meets that when k=1, $O_0=I_0$ if $I_0=I_1$, and $O_0=I_2$ otherwise; and when k>1, $O_{k-1}=I_{2k-1}$ if $O_{k-2}=I_{2k-1}$, and $O_{k-1}=I_{2k}$ otherwise.

It can be understood that an error-correction circuit with fault-tolerant nature provided by the present invention is provided with general commonality of application, and a specific function is determined by a digital input signal and a digital output signal. Because there is a unique certainty between input and output that are of the error-correction circuit with fault-tolerant nature, any circuit that meets a relationship between the input and output that are of the error-correction circuit with fault-tolerant nature provided by the present invention falls within the protection scope of the present invention. It can be understood that, because a logical relationship between the input and the output is uniquely certain, the error-correction circuit with fault-tolerant nature may be implemented only by a logic gate. There may be a plurality of specific implementation manners, as long as input and output meet the uniquely certain logical relationship of the present invention. Therefore, the error-correction circuit with fault-tolerant nature provided by the present invention is provided with general commonality.

The following introduces a specific internal implementation circuit of an error-correction circuit with fault-tolerant nature provided by an embodiment of the present invention with reference to the accompanying drawings.

Embodiment 2

Figure 5:
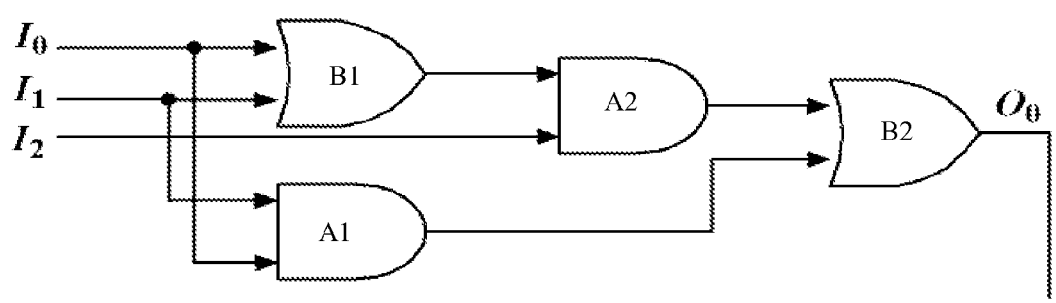
FIG. 5 is a schematic diagram of Embodiment 2 of an error-correction circuit with fault-tolerant nature according to the present invention.

Referring to FIG. 5, the figure is a schematic diagram of Embodiment 2 of an error-correction circuit with fault-tolerant nature provided by the present invention.

In the error-correction unit with fault-tolerant nature provided by this embodiment, when k=1, three corresponding digital input signals are separately $I_0$, $I_1$, and $I_2$; and one corresponding digital output signal is $O_0$.

The error-correction unit with fault-tolerant nature includes a first AND gate A1, a first OR gate B1, a second AND gate A2, and a second OR gate B2.

Two input signals of the first OR gate B1 are separately $I_0$ and $I_1$.

Two input signals of the first AND gate A1 are separately $I_0$ and $I_1$.

One input signal of the second AND gate A2 is $I_2$, and an output signal of the first OR gate B1 serves as the other input signal of the second AND gate A2.

An output signal of the second AND gate A2 and an output signal of the first AND gate A1 serve as two input signals of the second OR gate B2.

An output signal of the second OR gate B2 serves as the output signal $O_0$ of the error-correction unit with fault-tolerant nature.

From a relationship between the logic gates in the circuit in FIG. 5, it can be obtained that a relationship between input and output meets a truth table shown by Table 1.

Embodiment 3

Figure 6:
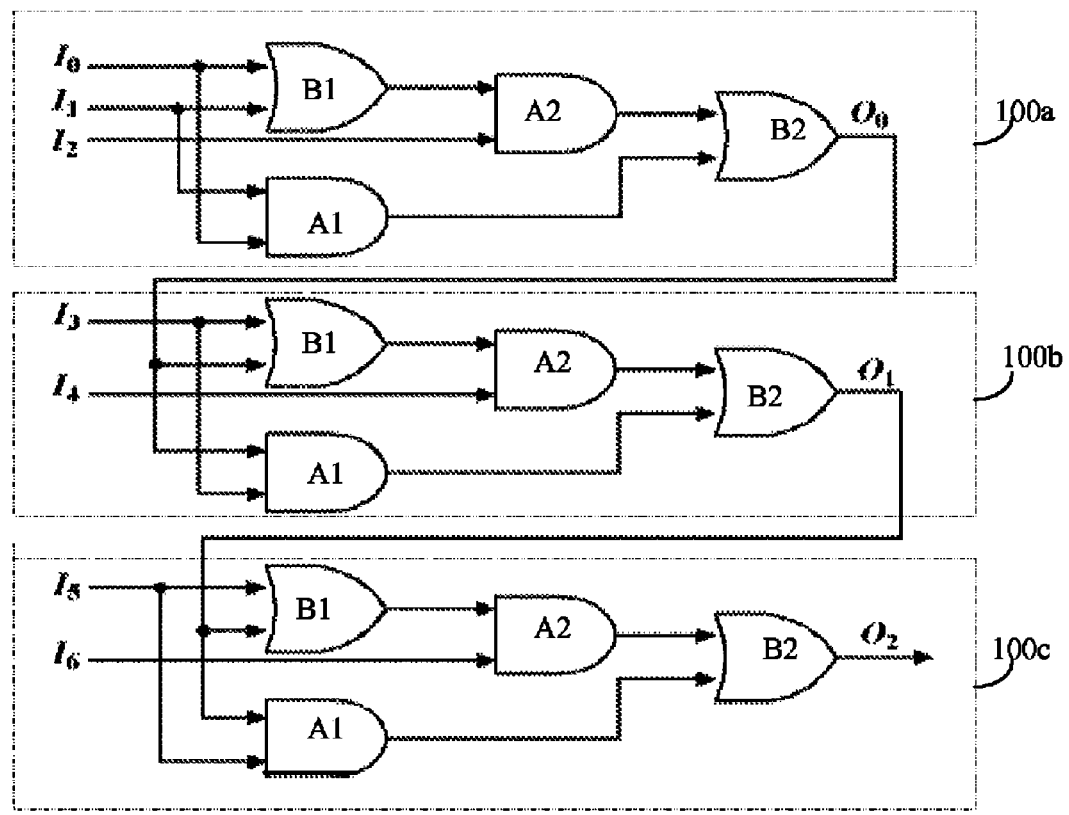
FIG. 6 is a schematic diagram of Embodiment 3 of an error-correction circuit with fault-tolerant nature according to the present invention.

FIG. 5 shows a circuit implementation manner where k=1, and the following introduces a circuit implementation manner where k=3 with reference to FIG. 6.

Referring to FIG. 6, the figure is a schematic diagram of Embodiment 3 of an error-correction circuit with fault-tolerant nature provided by the present invention.

In this embodiment, when k=3 in the error-correction unit with fault-tolerant nature, seven corresponding digital input signals are separately: $I_0$, $I_1$, $I_2$, $I_3$, $I_4$, $I_5$, and $I_6$; and three corresponding digital output signals are separately: $O_0$, $O_1$, and $O_2$.

The error-correction unit with fault-tolerant nature includes three error-correction subunits with fault-tolerant nature, which are separately a first error-correction subunit 100a with fault-tolerant nature, a second error-correction subunit 100b with fault-tolerant nature, and a third error-correction subunit 100c with fault-tolerant nature. Each error-correction subunit with fault-tolerant nature is corresponding to three digital input signals and one digital output signal; and each error-correction subunit with fault-tolerant nature includes a first AND gate A1, a first OR gate B1, a second AND gate A2, and a second OR gate B2.

Two input signals of both the first AND gate A1 and the first OR gate B1 are a first digital input signal and a second digital input signal; one input signal of the second AND gate A2 is a third digital input signal; the other input signal of the second AND gate A2 is an output signal of the first OR gate B2; and an output signal of the second AND gate A2 and an output signal of the first AND gate A1 serve as two input signals of the second OR gate B2.

A first digital input signal, a second digital input signal, and a third digital input signal of the first error-correction subunit 100a with fault-tolerant nature are $I_0$, $I_1$, and $I_2$, respectively; and an output signal of the first error-correction subunit 100a with fault-tolerant nature is $O_0$.

A first digital input signal, a second digital input signal, and a third digital input signal of the second error-correction subunit 100b with fault-tolerant nature are $I_3$, $I_4$, and $O_0$, respectively; and an output signal of the second error-correction subunit 100b with fault-tolerant nature is $O_1$.

A first digital input signal, a second digital input signal, and a third digital input signal of the third error-correction subunit 100c with fault-tolerant nature are $I_5$, $I_6$, and $O_1$, respectively; and an output signal of the third error-correction subunit 100c with fault-tolerant nature is $O_2$.

From a relationship between the logic gates in the circuit shown in FIG. 6, it can be obtained that a logical relationship between input and output meets a correspondence, between input and output, defined in Embodiment 1 of the present invention.

Based on the error-correction circuit with fault-tolerant nature provided by the foregoing embodiments, the present invention further provides a decoder which is implemented by using the error-correction circuit with fault-tolerant nature. Detailed introduction is provided below with reference to the accompanying drawings.

Embodiment 1 of a Decoder

Figure 7:
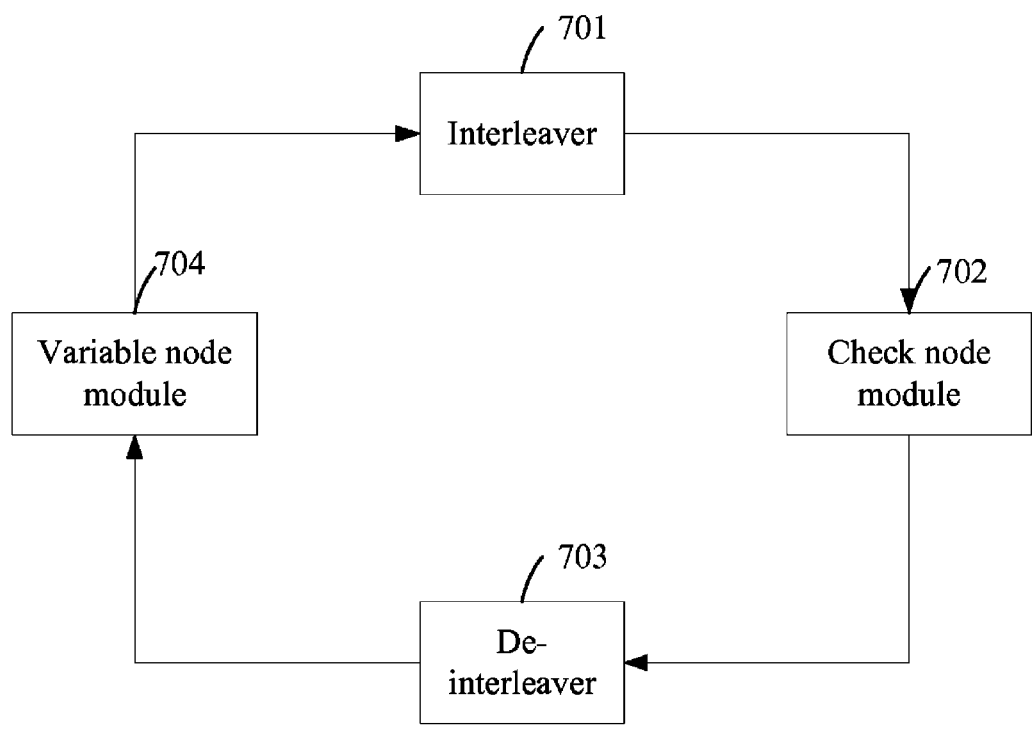
FIG. 7 is a schematic diagram of Embodiment 1 of a decoder according to the present invention.

Referring to FIG. 7, the figure is a schematic diagram of Embodiment 1 of a decoder according to the present invention.

The universal decoder provided by this embodiment includes a variable node module 704, an interleaver 701, a check node module 702, and a de-interleaver 703.

The variable node module 704 includes the universal error-correction circuit with fault-tolerant nature described in the foregoing embodiments.

The interleaver 701 is configured to randomly shuffle a received information sequence, then read the randomly shuffled information sequence from front to back, and send the read information sequence to the check node module 702.

The check node module 702 is configured to calculate external information output by the variable node module 704 to obtain an information value of a check node.

It should be noted that the check node module 702 may be implemented by an exclusive-OR gate circuit.

The de-interleaver 703 is configured to randomly shuffle an information sequence, and then arrange the randomly shuffled information sequence from back to front.

The variable node module 704 is configured to calculate external information output by the check node module 702 to obtain an information value of a variable node.

The variable node module 704 in the decoder provided by this embodiment may be implemented by the error-correction circuit with fault-tolerant nature provided by the foregoing embodiments of the present invention. By applying the error-correction circuit with fault-tolerant nature provided by the embodiments of the present invention, not only a decoding function may be implemented in the decoder, but also a fault-tolerant function may be implemented in the decoder.

Embodiment 2 of a Decoder

The following introduces in detail application of an error-correction circuit with fault-tolerant nature, provided by the present invention, in a decoder with reference to a specific embodiment.

Figure 8:
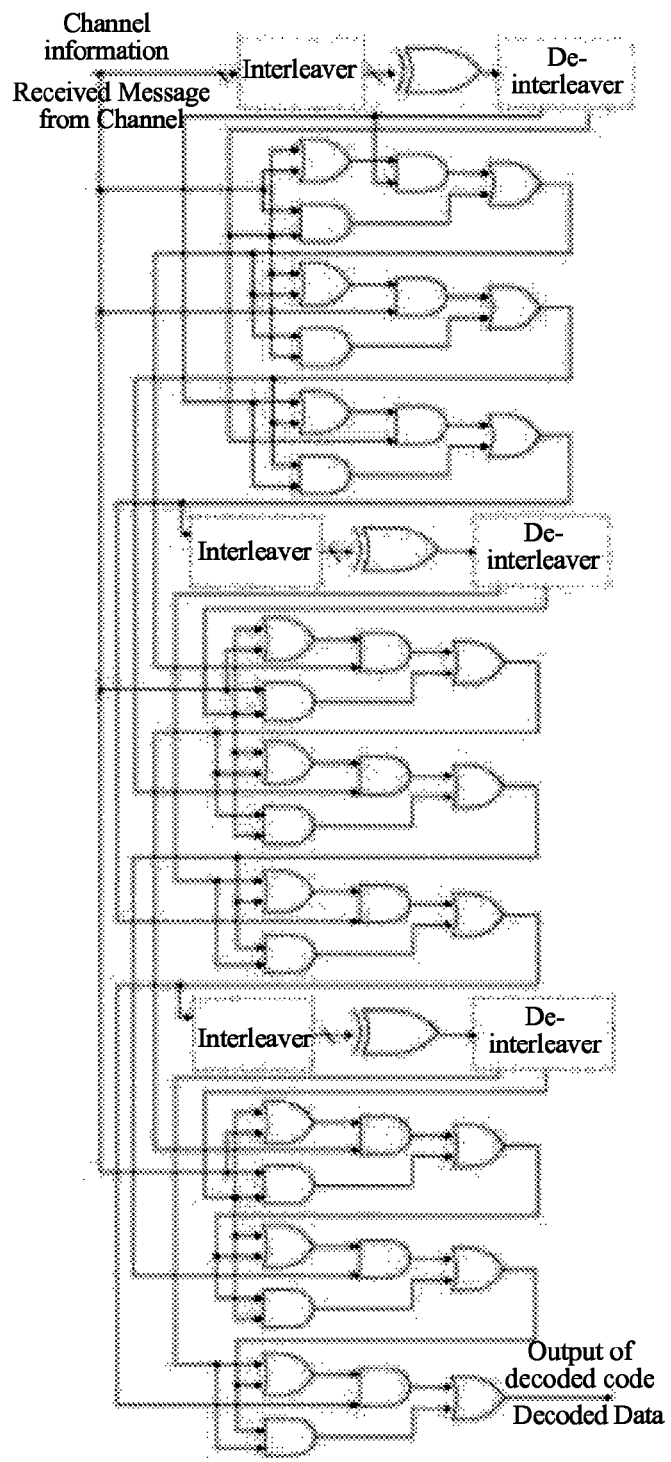
FIG. 8 is a schematic diagram of Embodiment 2 of a decoder according to the present invention.

Referring to FIG. 8, the figure is a schematic diagram of Embodiment 2 of a decoder according to the present invention.

In this embodiment, introduction is provided by using an example in which a weight of a variable node of a decoder is three. Further, the number of times of iterative decoding used by the decoder is three, and an circuit for performing iteration is not implemented by using a form of a counter circuit, but is implemented by directly using an error-correction circuit with fault-tolerant nature provided by the present invention, that is, the circuit for performing iteration is constructed by directly using a logic gate circuit. Details may be referred to a logic gate circuit shown in FIG. 8.

In FIG. 8, a represents a parameter of a binary symmetric channel (BSC).

In FIG. 8, three error-correction circuits with fault-tolerant nature are included.

It can be seen that internal structures of the three error-correction circuits with fault-tolerant nature are the same. Each error-correction circuit with fault-tolerant nature further includes three error-correction units with fault-tolerant nature inside, and internal structures of the three error-correction units with fault-tolerant nature are also the same, and the three error-correction units with fault-tolerant nature include same logic gates.

In a BSC simulation environment, a decoder circuit shown in FIG. 8 is configured to decode low density parity check code (LDPC). For example, LDPC (3, 6), [s, r] with a code length of 64, where s represents a source code byte part of a code word, r represents a redundancy byte part of the code word, 3 represents that a weight of a variable node in the decoder is 3, and 6 represents that a weight of a check node in the decoder is 6.

Figure 9:
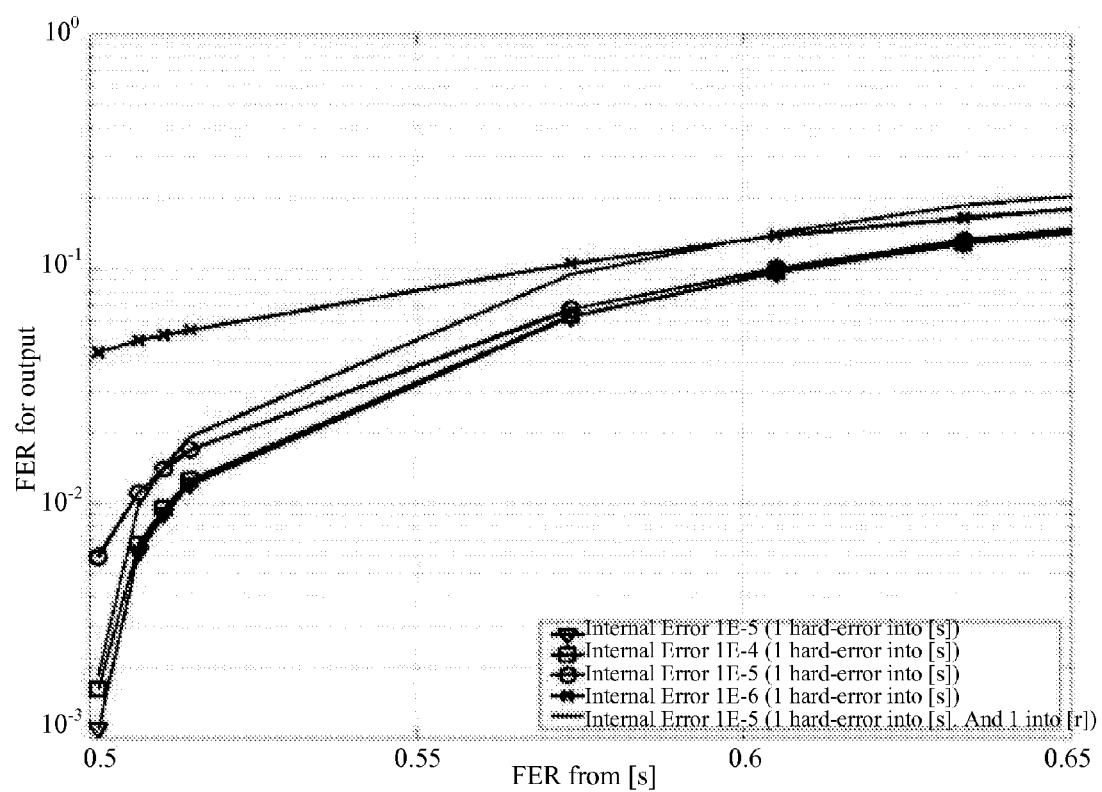
FIG. 9 is a schematic diagram of simulation of a decoder according to the present invention.

For a simulation result, reference may be made to FIG. 9, and the figure is a schematic diagram of simulation of a decoder according to the present invention.

A frame error rate (FER) of information received from a noisy channel is represented by an X axis in FIG. 9.

A decoding circuit in FIG. 8 is used, and in a BSC noisy channel simulation environment, (3, 6) LDPC code of a code length of 64 is used, [s, r], where s represents a source code byte part of a code word, and r represents a redundancy byte part of the code word, so as to perform the simulation. An FER of information received from the noisy channel is represented by the X axis in FIG. 9. In addition, noise of the BSC noisy channel is added to the decoding circuit shown in FIG. 8 to server as internal noise (Internal Error) of the decoding circuit, and a hard error is added to the source code byte part of the code word, so as to simulate a hard error rate of the simulation circuit.

A Y axis shown in FIG. 9 represents information that is generated after decoding and output by a decoder, where the decoder is based on an error-correction circuit with fault-tolerant nature, shown in FIG. 8, provided by the present invention.

It can be seen from FIG. 9 that when a frame error rate of input is close to 0.5, a frame error rate of output after decoding reduces to a level close to $10^{-3}$. Therefore, it can be seen that, by using a decoder including an error-correction circuit with fault-tolerant nature and provided by the present invention, and in an environment where the decoder has internal noise, a fault-tolerance and error-correction capability of the decoder has at least two orders of magnitude of error-correction performance.

In this embodiment, the decoder is configured to decode LDPC code. It can be understood that the decoder may decode many types of code, and no more examples are provided one by one in this embodiment of the present invention.

It can be seen from the foregoing analysis that a decoder provided by the present invention has a fast decoding speed, where only three times of decoding are needed to meet a requirement. However, a decoder in the prior art generally needs up to 20 times of decoding to meet the requirement.

In addition, a fault-tolerance and error-correction capability of the decoder provided by the embodiment is extremely strong, and the fault-tolerance and error-correction capability of the decoder has at least two orders of magnitude of error-correction performance. It should be noted that the decoder, shown in FIG. 8, is a specific application example of an error-correction unit with fault-tolerant nature provided by the present invention. It can be understood that the error-correction unit with fault-tolerant nature provided by the embodiment of the present invention may not only be applied in a decoder, but may be applied in many other circuits.

Based on the error-correction circuit with fault-tolerant nature provided by the foregoing embodiments, the present invention further provides a triple modular redundancy circuit which is implemented by applying the error-correction circuit with fault-tolerant nature. Detailed introduction is provided below with reference to the accompanying drawings.

Figure 10:
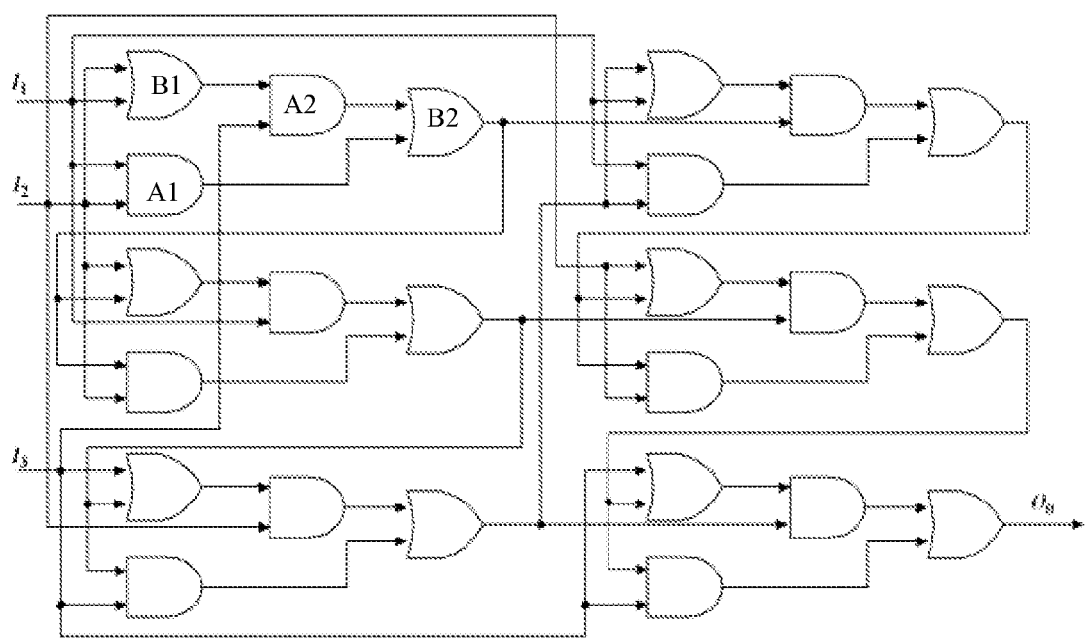
FIG. 10 is a circuit diagram of a triple modular redundancy circuit according to the present invention.

Referring to FIG. 10, the figure is a schematic diagram of a triple modular redundancy circuit according to the present invention.

The triple modular redundancy circuit totally includes three digital input signals, which are separately $I_1$, $I_2$, and $I_3$, and one digital output signal $O_0$.

It can be seen from FIG. 10 that the triple modular redundancy circuit includes six error-correction units with fault-tolerant nature, and each error-correction unit with fault-tolerant nature is also implemented by the logic gate circuit shown in FIG. 5.

The error-correction unit with fault-tolerant nature includes: a first AND gate A1, a first OR gate B1, a second AND gate A2, and a second OR gate B2.

Two input signals of the first OR gate B1 are separately $I_1$ and $I_2$.

Two input signals of the first AND gate A1 are separately $I_1$ and $I_2$.

One input signal of the second AND gate A2 is $I_3$, and an output signal of the first OR gate B1 serves as the other input signal of the second AND gate A2.

An output signal of the second AND gate A2 and an output signal of the first AND gate A1 serve as two input signals of the second OR gate B2.

An output signal of the second OR gate B2 serves as the output signal $O_0$ of the error-correction unit with fault-tolerant nature.

It should be noted that a voter in the triple modular redundancy circuit is implemented by a circuit in FIG. 10 provided by the present invention.

Figure 1:
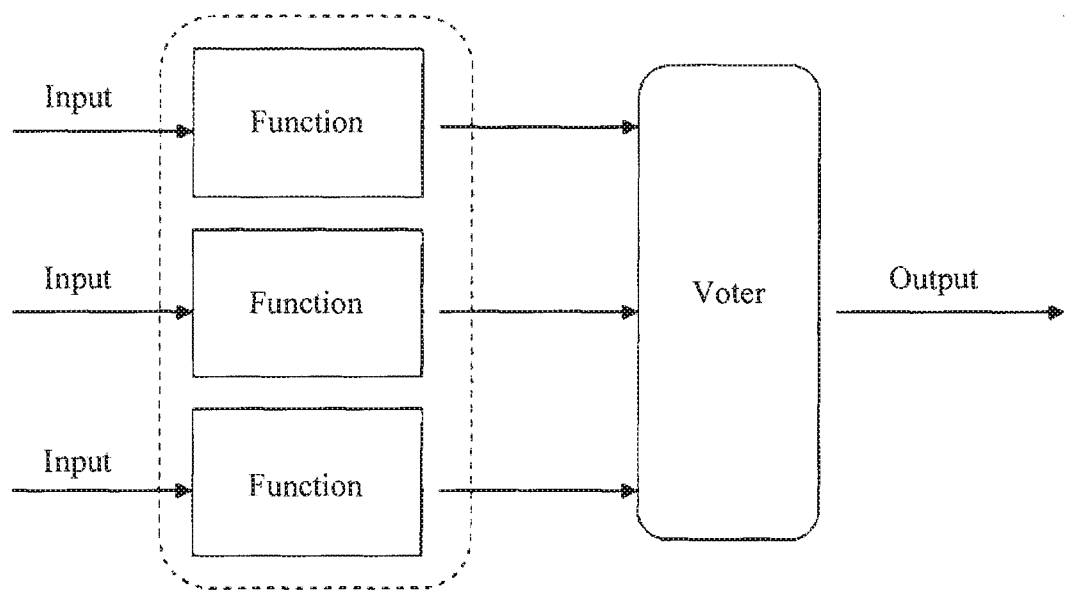
FIG. 1 is a schematic diagram of fault-tolerance of triple modular redundancy in the prior art.

In FIG. 1, three functions simultaneously execute a same operation. Output of the three functions serves as input of a voter; and the voter takes same output that is in the majority as correct output of a voting system, which is usually called two out of three.

As long as two same errors do not occur in the three functions simultaneously, an error of a faulty function may be concealed, so that correct system output is ensured. Because the three functions are independent of each other, a case where two functions have errors simultaneously is of an extremely small probability, so that system reliability may be greatly increased.

A function of the voter is implemented by the circuit provided in FIG. 10, and in a case in which there is an internal error, an extremely strong error-correction capability may be achieved.

A truth table of triple modular redundancy shown in FIG. 10 is as what is shown by Table 1, except that three input signals are $I_1$, $I_2$, and $I_3$, and an output signal is $O_0$. From the truth table shown by Table 1, it can be seen that a working principle of the voter in the triple modular redundancy circuit is a principle of two out of three where the majority prevails against the minority, that is, an output result of a whole system is determined by same output that is in the majority. When there are two input signals that are 0, the output result is 0; and when there are two input signals that are 1, the output result is 1. Consequently, a desirable fault-tolerant function is implemented.

It should be noted that the foregoing embodiments are introduced by using examples in which an error-correction circuit with fault-tolerant nature, provided by the embodiments of the present invention, is applied in a decoder and in a triple modular redundancy circuit. In addition, the error-correction circuit with fault-tolerant nature provided by the embodiments of the present invention may not only be applied in the forgoing circuits, but may be applied in many other circuits, for example, may be applied in an adder which needs fault-tolerance.

Specifically, three architectures shown in FIG. 6 may be used to implement a binary adder with a fault-tolerant function, which may at least correct one error digit of output.

The foregoing descriptions are merely exemplary embodiments of the present invention, but are not intended to limit any form of the present invention. Although the present invention has been disclosed above with the exemplary embodiments, the exemplary embodiments are not intended to limit the present invention. Any person skilled in the art may, without departing from the scope of the technical solutions of the present invention, make a number of possible variations or modifications to the technical solutions of the present invention by using the foregoing disclosed methods and technical content, or amend the technical solutions of the present invention to an equivalent embodiment that is an equivalent variation. Therefore, any simple amendment, equivalent variation and modification that are made to the foregoing embodiments according to technical essence of the present invention without departing from the content of the technical solutions of the present invention shall fall within the protection scope of the technical solutions of the present invention.

What is claimed is:

1. A universal error-correction circuit with fault-tolerant nature, comprising:
   an error-correction unit with fault-tolerant nature implemented by a logic gate,
   wherein digital input signals of the error-correction unit with fault-tolerant nature are separately $I_0, I_1, \ldots, I_{2k-1}$, and $I_{2k}$,
   wherein a number of the digital input signals that exist in the universal error-correction circuit with fault-tolerant nature is $2k+1$,
   wherein digital output signals of the error-correction unit with fault-tolerant nature are separately $O_0, O_1, \ldots, O_{k-2}$, and $O_{k-1}$,
   wherein a number of the digital output signals that exist in the universal error-correction circuit with fault-tolerant nature is $k$,
   wherein the digital input signals and the digital output signals belong to a set $\{0,1\}$,
   wherein $k$ is a positive integer,
   wherein the error-correction unit with fault-tolerant nature is configured to:
     set $O_0=I_0$ when $k=1$ and $I_0=I_1$;
     set $O_0=I_2$ when $I_0$ is not equal to $I_1$;
     set $O_{k-1}=I_{2k-1}$ when $k>1$ and $O_{k-2}=I_{2k-1}$; and
     set $O_{k-1}=I_{2k}$ when $O_{k-1}$ is not equal to $I_{2k-1}$,
   wherein when $k=3$ in the error-correction unit with fault-tolerant nature, seven corresponding digital input signals are separately $I_0, I_1, I_2, I_3, I_4, I_5$, and $I_6$, and three corresponding digital output signals are separately $O_0$, $O_1$, and $O_2$,
   wherein the error-correction unit with fault-tolerant nature comprises three error-correction subunits with fault-tolerant nature, which are separately a first error-correction subunit with fault-tolerant nature, a second error-correction subunit with fault-tolerant nature, and a third error-correction subunit with fault-tolerant nature, each error-correction subunit with fault-tolerant nature is corresponding to three digital input signals and one digital output signal, and each error-correction subunit with fault-tolerant nature comprises a first AND gate, a first OR gate, a second AND gate, and a second OR gate,
   wherein two input signals of both the first AND gate and the first OR gate are a first digital input signal and a second digital input signal, one input signal of the second AND gate is a third digital input signal, the other input signal of the second AND gate is an output signal of the first OR gate, and an output signal of the second AND gate and an output signal of the first AND gate serve as two input signals of the second OR gate,
   wherein a first digital input signal, a second digital input signal, and a third digital input signal of the first error-correction subunit with fault-tolerant nature are $I_0, I_1$, and $I_2$, respectively, and an output signal of the first error-correction subunit with fault-tolerant nature is $O_0$,
   wherein a first digital input signal, a second digital input signal, and a third digital input signal of the second error-correction subunit with fault-tolerant nature are $I_3, I_4$, and $O_0$, respectively, and an output signal of the second error-correction subunit with fault-tolerant nature is $O_1$, and
   wherein a first digital input signal, a second digital input signal, and a third digital input signal of the third error-correction subunit with fault-tolerant nature are $I_5, I_6$, and $O_1$, respectively, and an output signal of the third error-correction subunit with fault-tolerant nature is $O_2$.

2. The universal error-correction circuit with fault-tolerant nature according to claim 1, wherein the universal error-correction circuit with fault-tolerant nature comprises a universal decoder.

3. The universal error-correction circuit with fault-tolerant nature according to claim 2, wherein the universal decoder comprises a variable node circuit, an interleaver, a check node circuit, and a de-interleaver.

4. The universal error-correction circuit with fault-tolerant nature according to claim 3, wherein the variable node circuit comprises the universal error-correction circuit with fault-tolerant nature.

5. The universal error-correction circuit with fault-tolerant nature according to claim 3, wherein the interleaver is configured to randomly shuffle a received information sequence, read the randomly shuffled information sequence from front to back, and send the read information sequence to the check node circuit.

6. The universal error-correction circuit with fault-tolerant nature according to claim 3, wherein the check node circuit is configured to calculate external information output by the variable node circuit to obtain an information value of a check node.

7. The universal error-correction circuit with fault-tolerant nature according to claim 3, wherein the check node circuit comprises an exclusive-OR gate circuit.

8. The universal error-correction circuit with fault-tolerant nature according to claim 3, wherein the de-interleaver is configured to randomly shuffle an information sequence and arrange the randomly shuffled information sequence from back to front.

9. A universal error-correction circuit with fault-tolerant nature, comprising:
  an error-correction unit with fault-tolerant nature implemented by a logic gate,
  wherein digital input signals of the error-correction unit with fault-tolerant nature are separately $I_0, I_1 \ldots, I_{2k-1}$, and $I_{2k}$,
  wherein digital output signals of the error-correction unit with fault-tolerant nature are separately $O_0, O_1 \ldots, O_{k-2}$, and $I_{k-1}$,
  wherein the digital input signals and the digital output signals belong to a set $\{0,1\}$,
  wherein k is a positive integer, and
  wherein the error-correction unit with fault-tolerant nature is configured to:
    set $O_0=I_0$ when k=1 and $I_0=I_1$;
    set $O_0=I_2$ when $I_0$ is not equal to $I_1$;
    set $O_{k-1}=I_{2k-1}$ when k>1 and $O_{k-2}=I_{2k-1}$; and
    set $O_{k-1}=I_{2k}$ when $O_{k-1}$ is not equal to $I_{2k-1}$,
  wherein when k=3 in the error-correction unit with fault-tolerant nature, seven corresponding digital input signals are separately $I_0, I_1, I_2, I_3, I_4, I_5$, and $I_6$, and three corresponding digital output signals are separately $O_0, O_1$, and $O_2$,
  wherein the error-correction unit with fault-tolerant nature comprises three error-correction subunits with fault-tolerant nature, which are separately a first error-correction subunit with fault-tolerant nature, a second error-correction subunit with fault-tolerant nature, and a third error-correction subunit with fault-tolerant nature, each error-correction subunit with fault-tolerant nature is corresponding to three digital input signals and one digital output signal, and each error-correction subunit with fault-tolerant nature comprises a first AND gate, a first OR gate, a second AND gate, and a second OR gate,
  wherein two input signals of both the first AND gate and the first OR gate are a first digital input signal and a second digital input signal, one input signal of the second AND gate is a third digital input signal, the other input signal of the second AND gate is an output signal of the first OR gate, and an output signal of the second AND gate and an output signal of the first AND gate serve as two input signals of the second OR gate,
  wherein a first digital input signal, a second digital input signal, and a third digital input signal of the first error-correction subunit with fault-tolerant nature are $I_0, I_1$, and $I_2$, respectively, and an output signal of the first error-correction subunit with fault-tolerant nature is $O_0$,
  wherein a first digital input signal, a second digital input signal, and a third digital input signal of the second error-correction subunit with fault-tolerant nature are $I_3, I_4$, and $O_0$, respectively, and an output signal of the second error-correction subunit with fault-tolerant nature is $O_1$, and
  wherein a first digital input signal, a second digital input signal, and a third digital input signal of the third error-correction subunit with fault-tolerant nature are $I_5, I_6$, and $O_1$, respectively, and an output signal of the third error-correction subunit with fault-tolerant nature is $O_2$.

10. The universal error-correction circuit with fault-tolerant nature according to claim 9, wherein the universal error-correction circuit with fault-tolerant nature comprises a universal decoder.

11. The universal error-correction circuit with fault-tolerant nature according to claim 10, wherein the universal decoder comprises a variable node circuit, an interleaver, a check node circuit, and a de-interleaver.

12. The universal error-correction circuit with fault-tolerant nature according to claim 11, wherein the variable node circuit comprises the universal error-correction circuit with fault-tolerant nature.

13. The universal error-correction circuit with fault-tolerant nature according to claim 11, wherein the interleaver is configured to randomly shuffle a received information sequence, read the randomly shuffled information sequence from front to back, and send the read information sequence to the check node circuit.

14. The universal error-correction circuit with fault-tolerant nature according to claim 11, wherein the check node circuit is configured to calculate external information output by the variable node circuit to obtain an information value of a check node.

15. The universal error-correction circuit with fault-tolerant nature according to claim 11, wherein the check node circuit comprises an exclusive-OR gate circuit.

16. The universal error-correction circuit with fault-tolerant nature according to claim 11, wherein the de-interleaver is configured to randomly shuffle an information sequence and arrange the randomly shuffled information sequence from back to front.

* * * * *